United States Patent [19]

Borkowicz

[11] Patent Number: 4,868,703
[45] Date of Patent: Sep. 19, 1989

[54] SOLID STATE SWITCHING DEVICE

[75] Inventor: Jerzy Borkowicz, Whitburn, Canada

[73] Assignee: Northern Telecom Limited, Montreal, Canada

[21] Appl. No.: 306,789

[22] Filed: Feb. 6, 1989

[51] Int. Cl.[4] .............................................. H02H 9/00
[52] U.S. Cl. ...................................... 361/58; 361/91; 323/315
[58] Field of Search ....................... 361/58, 86, 91, 111, 361/117, 119; 307/630, 638, 639, 643; 357/48, 33, 34, 37, 39; 323/315

[56] References Cited

U.S. PATENT DOCUMENTS 4,530,023  7/1985  Brown ................................... 361/58
4,595,941  6/1986  Avary ................................... 361/914

Primary Examiner—Derek S. Jennings
Attorney, Agent, or Firm—Philip W. Jones

[57] ABSTRACT

A solid state switching device allows independent control of the latching and holding currents, and has particular application to telephone systems. The holding current may be set at a high level so as to return the switching device to the off-state without a large reduction in the current to the circuit embodying the switching device, whereas the latching current may be set at a low level to reduce the heat dissipation in the device just prior to the transition from the latching state to the holding state. The device, which may be implemented in either linear technology or with discrete components, is a thyristor structure defined by npn and pnp bipolar transistor devices each having its base connected to the collector of the other. Each transistor device has a resistance between its base and emitter, and in the case of at least one of the transistor devices that resistance varies with the voltage on the collector of the associated transistor device.

11 Claims, 4 Drawing Sheets

SOLID STATE SWITCHING DEVICE

The invention relates to a solid state switching device, and more particularly, to a switching device in which the latching and holding currents may be independently controlled.

This invention has application to the type of switching device which, when fabricated on a semiconductor wafer, is referred to as a thyristor. A thyristor has four layers which can be designated p1-n1-p2-n2, representing three p-n junctions in series. At low voltage levels, current is effectively blocked from moving from the p1 region to the n2 region by the reversed n1-p2 junction. However, if a voltage of sufficiently large magnitude is applied across the structure, a state is entered in which the avalanche breakdown of the n1-p2 junction is reached and current through the device begins to increase; the voltage at that point is referred to as the 'forward-breakdown voltage' ($V_{BO}$). After the current has increased to the 'latching current' ($I_L$), a transition to a 'forward conducting state' occurs in which the voltage drops almost instantaneously from a 'forward-breakover voltage' ($V_{BF}$) to a fraction of that value. The magnitude of $V_{BF}$ and $I_L$ are a function of the particular structure. The voltage value after the transition is referred to as the 'holding voltage' $V_H$, and the corresponding current is referred to as the 'holding current' ($I_H$). The forward conducting state has low impedance, and small changes in the applied voltage in that state result in large changes in the current.

When such a switching device is used, for example as an overvoltage protection device, the low-voltage forward conducting state exhibits a short-circuit behaviour with high current flowing through low impedance. It is often desirable in telephone systems that the holding current be set at a sufficiently high level that returning the switching device to the off state does not require a large reduction in the current to the circuit embodying the switching device. For example, in primary protection applications, the holding current must be in the range of 300 mA. For prior art solid state devices used in such applications, that current also approximates the latching current at $V_{BF}$, which is in the range of 200 to 400 volts. The heat dissipation in the switching device just prior to the transition to the holding state is therefore large in comparison to that experienced in the forward blocking region (low current) and in the forward conducting state (low voltage). If the current passing through the device should be slightly less than that required for the transition from $V_{BF}$ to $V_H$ for an extended period and if $V_{BF}$ and $I_L$ are large, the device may undergo degradation through excessive power dissipation. It is therefore desirable to have a switching device in which the latching current at the transition from the latching state to the holding state is significantly less than the holding current, and the subject invention is directed to that end. Such transition is reflected by an increase in the slope of the negative-resistance ($-dI/dV$) line, which is designated as 12 in FIG. 1.

SUMMARY OF THE INVENTION

In its most general form, the invention is a solid state switching circuit adapted to be connected between two conductors for providing two alternate impedance states between those conductors. The circuit comprises a pnp transistor device and a npn transistor device, the base of each device being electrically connected to the collector of the other device. The emitter of each device is adapted to be electrically connected to a respective one of the conductors. The circuit further comprises a resistance element electrically connected to an associated one of the transistor devices. One end of the resistance element is connected to the base of the associated transistor device, and the other end of the resistance element is connected to the emitter of the associated transistor device. The resistance element has a variable resistance which varies with the voltage on the collector of the associated transistor device.

The variable resistance element may comprise a voltage-controlled current regulating element. A control terminal of the regulating element is electrically connected to the collector of the associated transistor device, and the voltage on that collector determines the amount of current flowing between the base and emitter of the associated transistor device. The variable resistance element may also comprise a fixed resistor element connected in parallel with the current regulating element.

In a further form of the invention, the circuit may comprise a second resistance element electrically connected between the base and emitter of the other transistor device. Both of the resistance elements may have a variable resistance. In this arrangement, each resistance element may comprise a voltage-controlled current regulating element. A control terminal of each of the regulating elements is connected to the collector of the respective associated transistor device, and the voltage on the respective collector determines the amount of resistance between the base and emitter of the associated transistor device. Each of the resistance elements may comprise a fixed resistor element connected in parallel with the respective current regulating element.

The circuit of the invention may either be built from discrete components or be produced on a semiconductor wafer. With respect to the latter form, either n-substrate or p-substrate material may be utilized. A thyristor structure having p1, n1, p2, and n2 regions is produced by diffusion or other processing of that material. The outer surface of the p1 region has a first conductive layer extending across it, and the outer surface of the n2 region has a second conductive layer extending across it. The two conductors are each adapted to connect to a respective one of the conductive layers. One bipolar transistor device is defined by the p1, n1 and p2 regions, and the other device is defined by the n1, p2, and n2 regions. The variable resistance element is defined by a portion of the p2 region that in part extends through apertures in the n2 region to contact the second conductive layer. The resistance of that resistance element varies with the thickness of the depletion region formed in the p2 region by a voltage differential applied between the first and second conductors. It is also possible to construct a device having a complementary construction, in which the variable resistance element is defined by a portion of the n1 region that in part extends through apertures in the p1 region to contact the first conductive layer. A still further form of the invention is a structure that includes both types of variable resistance element.

A pair of discrete bipolar transistors may also be used to create the circuit, one transistor being a npn-type and the other being a pnp-type. The base of each transistor is connected to the collector of the other transistor. The variable resistance element comprises a field-effect transistor and a first resistor, those devices being configured such that the channel of the field-effect transistor is in series with the first resistor. The gate of the field-effect transistor is connected to the collector of the associated bipolar transistor such that the voltage on the collector controls the resistance between the base and emitter of the associated bipolar transistor. This discrete component form of the invention may also comprise a zener diode positioned between the bases of the bipolar transistors, the voltage across the diode defining the forward-breakdown voltage of the switching circuit. The circuit may be utilized in combination with a series of diodes forming a rectifier bridge, that arrangement allowing connection of the circuit between conducting lines having a voltage differential of varying polarity.

The invention will next be described in terms of several preferred embodiments utilizing the accompanying drawings.

DETAILED DESCRIPTION OF THE DRAWINGS

Figure 1:
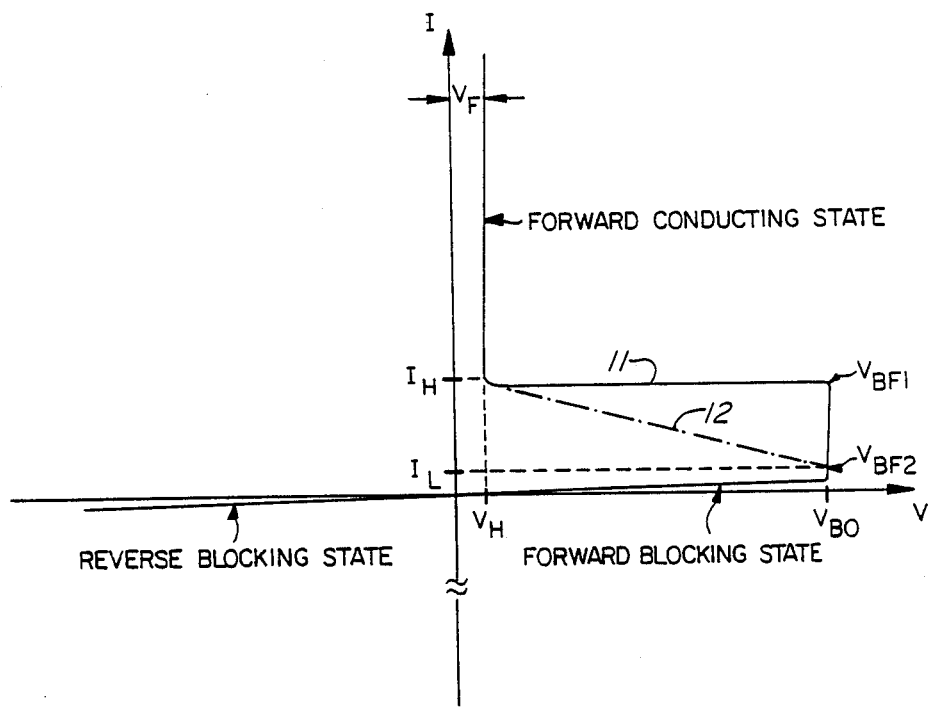
FIG. 1 is a graphical representation comparing typical voltage-current characteristics of the switching circuit of the invention with typical voltage-current characteristics of a prior art switching circuit.

In FIG. 1 the voltage-current characteristics of a typical prior art switching circuit are compared with those of the switching circuit of the invention. The line designated 11 indicates the $V_{BF}$ to $V_H$ transition of the prior art structure. The transition region is one of negative resistance, in which a slight increase in current results in a large reduction in voltage. In comparison, the line designated 12 indicates the transition from the latching state to the holding state which is associated with the switching circuit of this invention.

Figure 2:
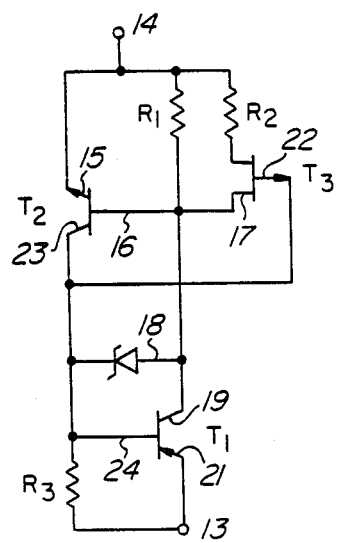
FIG. 2 is a schematic diagram of a discrete component circuit in a first embodiment of the switching circuit of the invention.
Figure 3:
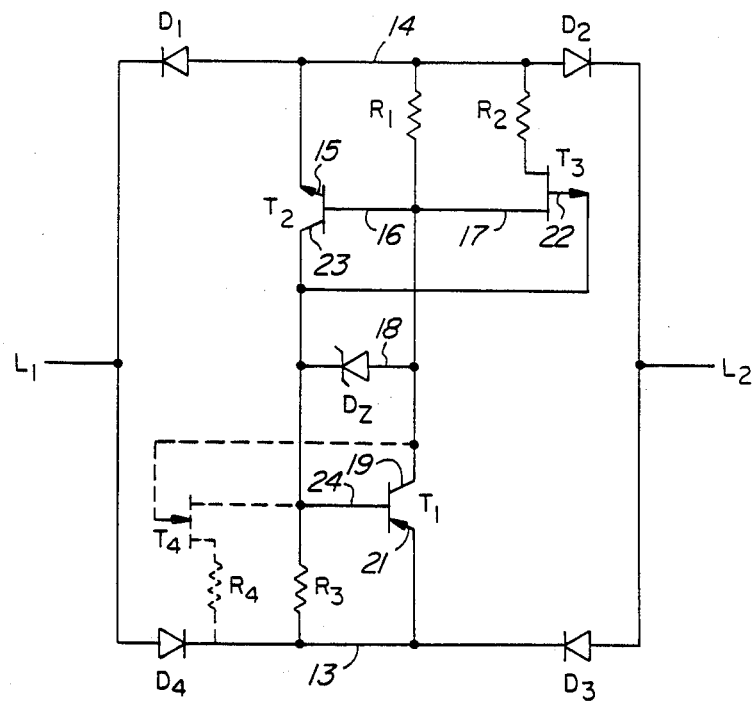
FIG. 3 is a schematic diagram of the discrete component circuit of FIG. 2 with the addition of a diode bridge and other optional components.

A discrete component form of the switching circuit is illustrated in FIGS. 2 and 3. In those figures, node 13 is more positive than node 14. A bipolar pnp tansistor $T_1$ is connected to a bipolar npn transistor $T_2$ such that the base of each device is connected to the collector of the other device. The emitter of transistor $T_1$ is connected to node 13, and the emitter of transistor $T_2$ is connected to node 14. Transistor $T_2$ has a bypass resistor $R_1$ connected between its emitter and base, and a zener diode $D_Z$ connects the bases of the transistors. Transistor $T_3$ is a p-channel depletion-mode field-effect transistor (FET) having its source connected to the base of transistor $T_2$ and its drain connected through a resistor $R_2$ to node 14. The gate of FET $T_3$ is connected to the collector of transistor $T_2$. Another bypass resistor $R_3$ (shown in outline in FIG. 2) can be connected between the emitter and base of transistor $T_1$.

With reference to the forward blocking region denoted in FIG. 1, the voltage differential between nodes 13 and 14 must exceed the threshold value $V_{BF}$ before the switching circuit of FIG. 2 turns on. Once the circuit turns on, large currents pass between nodes 13 and 14 through a small differential forward voltage $V_F$. The discrete component circuit of FIG. 2 operates in the following manner. In the forward blocking state the negative voltage on node 14 is experienced at the emitter 15 of transistor $T_2$. Through the forward polarized emitter-base junction of transistor $T_2$ and resistor $R_1$ this voltage appears at the base 16 of transistor $T_2$, at the source 17 of FET $T_3$, at the anode 18 of zener diode $D_Z$, and at the collector 19 of the transistor $T_1$. Similarly, the voltage on the positive node 13 is experienced at the emitter 21 and base 24 of the transistor $T_1$, at the cathode of the zener diode $D_Z$, and at the collector 23 of transistor $T_2$. Transistors $T_1$ and $T_2$ are not conducting and a large impedance exists between the cathode and the anode of zener diode $D_Z$. The voltage between nodes 13 and 14 appears essentially unchanged between the drain 17 and gate 22 of FET $T_3$. As a result, FET $T_3$ is not conducting and the resistor $R_2$ is essentially disconnected from the base 16 of transistor $T_2$. Below the breakdown voltage of zener diode $D_Z$, this circuit is functioning in the forwared blocking region on the voltage-current characteristic of FIG. 1.

Once the voltage differential between nodes 13 and 14 exceeds the breakdown voltage of the zener diode $D_Z$, current passes through the resistor $R_1$, through zener diode $D_Z$ and through the emitter-base junction of transistor $T_1$. When this current reaches a value such that the voltage drop across the resistor $R_1$ exceeds the threshold voltage of the emitter base junction of transistor $T_2$ (approx. 0.6 volts), current begins to pass between the collector 23 and emitter 15 of transistor $T_2$. Transistors $T_1$ and $T_2$ both begin to turn on, and a positive feedback action results from the connection of the collector 23 of transistor $T_2$ to the base 24 of transistor $T_1$ and the connection of collector 19 of transistor $T_1$ to the base 16 of transistor $T_2$. The onset of this process is defined by the value of the resistor $R_1$, and corresponds to the breakover point $V_{BF2}$ in FIG. 1. The positive feedback action causes the collector-emitter currents of both of the transistors $T_1$ and $T_2$ to increase, resulting in eventual saturation of both transistors; the current increase is reflected by the line 12 in FIG. 1. Simultaneously, the differential voltage between the collectors 19 and 23 decreases to a low value, and the voltage differential between nodes 13 and 14 correspondingly decreases to the holding voltage $V_2$ shown in FIG. 1. The device is then in the forward conducting state.

With this invention, as the voltage differential between the collectors 19 and 23 decreases, the voltage differential between the gate 22 and source 17 of FET $T_3$ also decreases. FET $T_3$ is a depletion-mode device, its source-to-drain resistance varying in inverse proportion to the voltage differential between gate 22 and source 17. FET $T_3$ is selected so as to be fully non-conductive when the voltage differential between nodes 13 and 14 is, for example equal to 90% of $V_{BO}$ and fully conductive when the voltage differential between nodes 13 and 14 is approximately equal to $V_F$. In the conductive state, the resistor $R_2$ is connected essentially in parallel with the resistor $R_1$. The parallel combination of resistors $R_2$ and $R_1$ determines the holding current $I_H$ and the holding voltage $V_H$ in the same way that the resistor $R_1$ determines the latching current $I_L$ and the breakover voltage $V_{BF}$, as depicted in FIG. 1. The ratio of the holding current to the latching current is approximately equal to the function $(R_1/R_2)+1$.

As illustrated in FIG. 1, the presence of FET $T_3$ creates a pronounced separation between the latching current and the holding current. Line 12 represents the switching characteristic for the circuit of FIG. 2, while line 11 represents the switching characteristic for the same circuit with FET $T_3$ shorted and resistor $R_2$ connected directly to base 16 of transistor $T_2$. By allowing for a decrease in the latching current with respect to the holding current, the device provides independent control of the holding and latching states.

FIG. 3 combines the circuit of FIG. 2 with a diode bridge composed of four diodes, $D_1$, $D_2$, $D_3$ and $D_4$. The diode bridge rectifies voltage differentials appearing across $L_1$ and $L_2$, and results in node 13 always being more positive than node 14. The FET transistor $T_4$ and resistor $R_4$, which are shown in outline in FIG. 3, may optionally be added to the circuit to increase the range of control over the ratio of holding to latching currents; those components act in a manner complementary to that earlier described with respect to FET transistor $T_3$ and resistor $R_2$.

Figure 4:
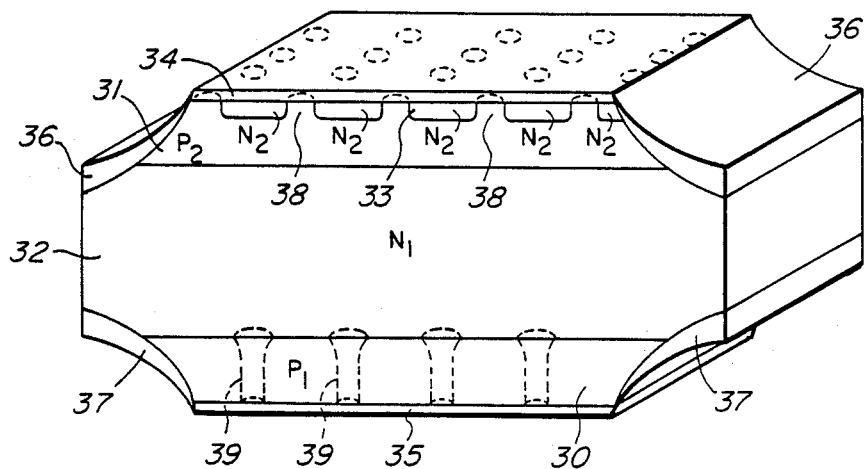
FIG. 4 is a sectioned view of a semiconductor wafer in a second embodiment of the switching circuit.
Figure 5:
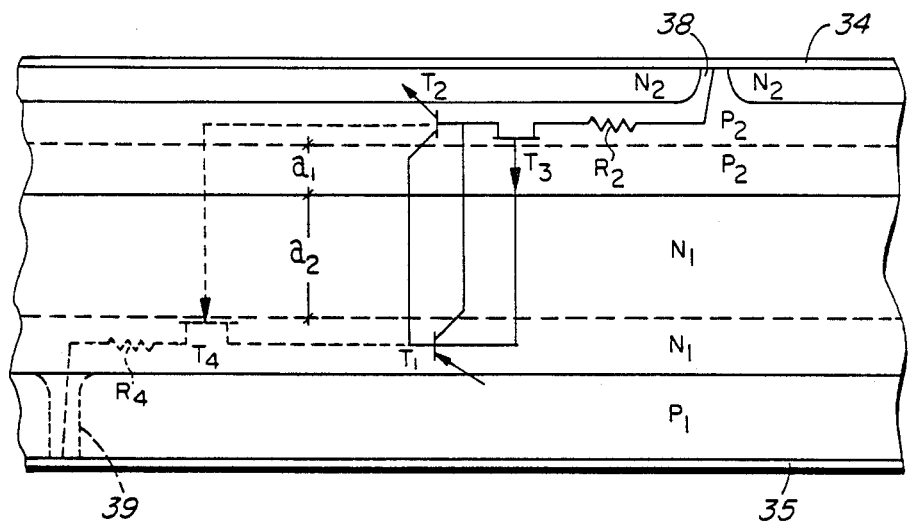
FIG. 5 is a cross-sectional view of the semiconductor wafer of the second embodiment, the view having discrete component symbols superimposed and also illustrating the width of the depletion zone at the n1-p2 junction.

FIGS. 4 and 5 illustrate a second embodiment of the invention, an implementation of the circuit on a semiconductor wafer. The wafer has two p-type regions, p1 and p2, each extending on an opposite side of a n-type region, n1. A n-type region, n2, extends into the p2 region. One means of producing such a structure is by diffusion of a p-type dopant into a n-type substrate, with subsequent diffusion of a n-type dopant into one of the p-type regions created by the first diffusion. Planar conduction layers 34 and 35 each extend across a respective opposite side of the device. Isolation layers 36 and 37 define the sides of the p1, p2 and n2 regions. The n2 region is created with a series of windows 38 through which the p2 region extends to contact conduction layer 34. Whenever reference is made hereafter to the width of the p2 region, that reference is to the distance between the n1 and n2 regions and not to the width of the p2 region at the windows 38.

Although the semiconductor device of the second embodiment of the invention appears quite dissimilar to that of the first embodiment, their operation is analogous if the dimensions and doping levels of the semiconductor device are selected appropriately. Thyristor devices having a structure similar to that shown in FIGS. 4 and 5 are usually designed such that the width of the p2 region between the n1 and n2 regions is several times greater than the maximum width of the depletion zone in the p2 region at the breakdown voltage of the device. In the second embodiment of the invention, the width and doping level of the p2 region must be closely controlled. Below the breakover voltage of the device, current is prevented from passing through the device by the reverse-bias zone at the junction of the n1 and p2 regions. As the voltage across the device is increased toward the breakdown voltage the width of the depletion zone at the n1-p2 junction increases. A first portion of the depletion zone extends into the p2 region; it has a width $a_1$. Another portion of the depletion zone extends into the n1 region; it has a width $a_2$. With the device of this invention the width of the p2 region is only slightly greater than the width expected at the depletion zone in the p2 region at the breakover voltage of the device. The excluded portion of the p2 region, ie. that portion which remains outside of the depletion zone and varies in thickness with the voltage differential applied to the device, acts in an analogous manner to the channel of FET transistor of the discrete component embodiment. The resistance of the excluded portion of the p2 region to current flow parallel to the n1-p2 junction varies with the thickness of the excluded portion, and thus varies with the voltage applied across the device. The n1 region may optionally extend through the p1 region to contact the conductor 35 by means of the series of cylindrical windows 39 shown in outline in FIG. 4. That optional structure, which can be made equivalent to the FET transistor $T_4$ and resistor $R_4$ of FIG. 3, may be added to create a slight improvement in circuit performance.

The analogy between the first and second embodiments of the invention has been made clearer by placing symbols for the analogous discrete components onto the cross-sectional view of the semiconductor wafer of FIG. 5. A npn transistor ($T_2$) is drawn between the n1, p2 and n2 regions, and a pnp transistor ($T_1$) is drawn between the p1, n1 and p2 regions. Current entering the base of the npn transistor moves from conduction layer 34 through one of the windows 38. After passing through the window, the current passes through that portion of the p2 region that is outside of the depletion zone of the n1-p2 junction; it moves in a direction parallel to that junction. Alternate FET transistor $T_4$ and resistor $R_4$ are shown in outline in FIG. 5 for the case where the windows 39 are present in the p1 region.

Figure 6:
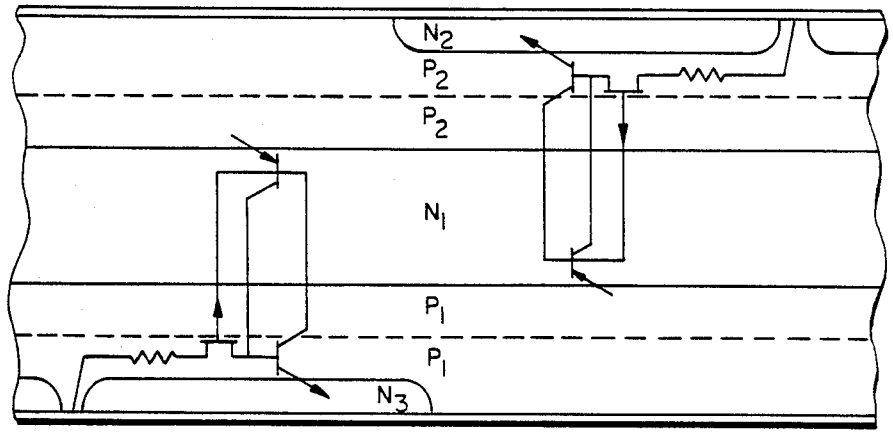
FIG. 6 is a cross-sectional view of the semiconductor wafer of the second embodiment, the wafer having the addition of a n3-layer for defining a second switching circuit; and, FIG. 7 is a graphical representation of the voltage-current characteristic of a device embodying the two switching circuits of FIG. 6.
Figure 7:
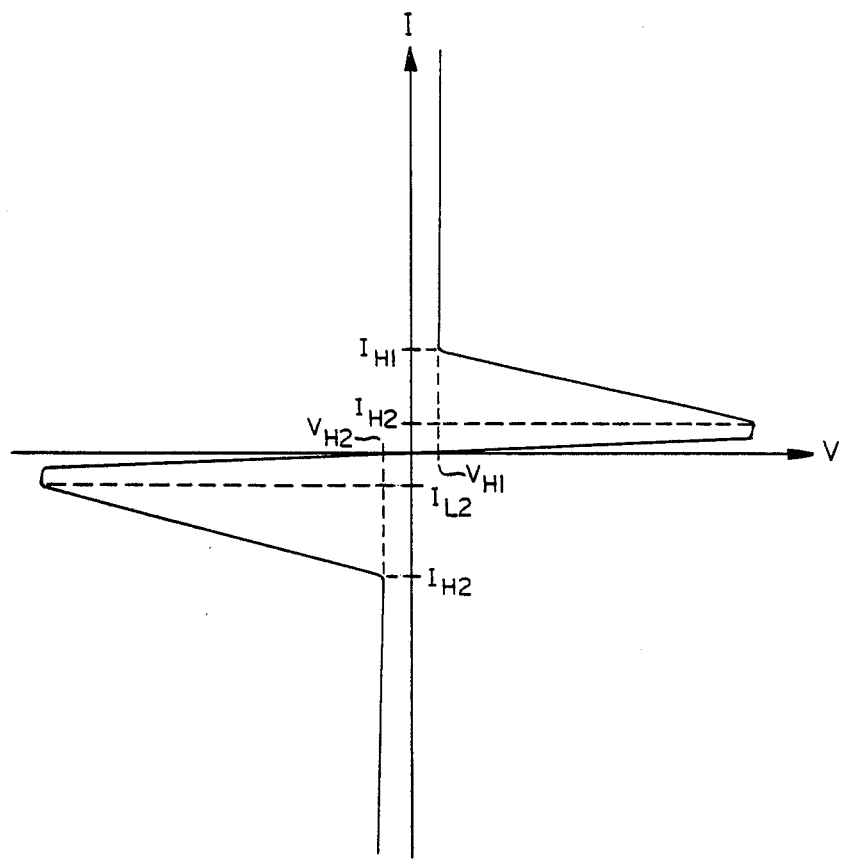

FIG. 6 illustrates a semiconductor wafer in which two switching devices of the second embodiment of the invention are present. The devices are positioned back-to-back, and act in a manner functionally equivalent to a bidirectional diode thyristor. The p1, n1, p2 and n2 regions form a device having a switching characteristic corresponding to that previously described (and illustrated in FIG. 1). The n3, p1, n1 and n2 regions form a second device having a switching characteristic which is similar in shape to that shown in the first quadrant of FIG. 1 but adapted to extend in the third quadrant. FIG. 7 illustrates the switching characteristic for the device of FIG. 6.

With respect to the basic form of the invention shown in FIGS. 1 to 5, an example will next be given to illustrate the calculation of the relative width of the n and p regions necessary to create in a semiconductor wafer voltage-current characteristics analogous to those described with respect to the discrete component version of the switching circuit.

The ratio of the holding current to the latching current is first selected; this ratio will be designated 'm'. In the case of an integrated protection device having a breakover voltage of 300 volts and a holding current equal at least to approximately 0.25 amperes to 0.3 amperes, the preferred value of the latching current is equal to approximately 30 milliamperes or less. The minimum 'm' value is thus approximately 12. Therefore, the ratio of the sheet resistance of the p2 region between the n1 and n2 regions in the forward conducting state to the sheet resistance of that p2 region at the breakover voltage should also be approximately 12.

The sheet resistance of the p2 region in the forward conducting state defines the holding current of the device through the approximate equation:

$$i_h = (V_{beh})/(R_{sb})(K)$$

where $i_h$ is the holding current, $V_{beh}$ in the potential drop across the n1-p2 junction at turn-off, $R_{sb}$ is the sheet resistance of the p2 region with $V_{beh}$ applied, and K is a constant referred to as the 'effective emitter aspect ratio' which depends on the geometry of the p2 and n2 regions, ie. the amount and relative size of the p2 and n2 regions. $V_{beh}$ is a weak function of current and the effective emitter aspect ratio. If a value for K of 7000 is assumed, $R_{sb}$ at $V_{beh}$ must be no greater than 13,000 ohms. At the breakover voltage $R_{sb}$ should be at least 155,000 ohms.

In this example, it is assumed that the p2 region base layer and the n2 region emitter layer are produced by means of a two-step diffusion which results in the shape of the distribution of the doping elements in those layers being approximated by the normal distribution function. The preferred end doping surface concentration of the p2 base layer after diffusion is approximately equal to $10^{18}$ cm$^{-3}$. This value results from the compromise between the goal of introducing the maximum amount of the dopant to the base layer without substantially decreasing the lifetime of the minority carriers in that layer. In this example, a 4-$\mu$m. p2 layer is created by the initial diffusion. To produce the required breakover voltage, the n1 background wafer doping should be approximately equal to $7 \times 10^{14}$ cm$^{-3}$. A voltage of 0.6 volts applied across this device will produce a depletion layer that penetrates the p2 layer to a depth of approximately 0.45 $\mu$m., while a voltage of 300 volts applied across this device will produce a depletion region that penetrates the p2 layer to a depth of approximately 1.385 $\mu$m. (2.615 $\mu$m. of the p2 diffusion layer not being included in the depletion region). In order to produce the desired holding current and the 'm' value the n2 layer thickness required is 2.5 $\mu$m. A second diffusion is then performed in which the n2 emitter layer is created having an end doping surface concentration approximately equal to $5 \times 10^{19}$ cm$^{-3}$. This process produces a device in which the p2 net base sheet resistance under the n2 emitter is equal to approximately 12,910 ohms at 0.6 volts applied to the device, and equal to approximately 155,000 ohms at 300 volts. For every selected value of 'm' and specified parameters for the p2 and n2 regions, the corresponding depth of the n2 region has a unique value.

Although the described embodiment has related to a device formed on a n-type substrate material, a complementary device could be formed on a p-type substrate material. A first diffusion process would be utilized to transform opposite sides of the substrate material into n1 and n2 regions, and a subsequent diffusion process would be utilized to transform an outer portion of the n2 region into a p2 region. In this embodiment, a similar methodology to that previously described would be applied to determine the depth of the p2 region.

I claim:

1. A solid state switching circuit adapted to be connected between two conductors, the circuit comprising a pnp bipolar transistor device and a npn bipolar transistor device, each device having its base electrically connected to the collector of the other device, the emitter of each device being adapted to be electrically connected to a respective one of the conductors, the circuit further comprising two resistance elements each electrically connected to a respective associated one of the transistor devices such that one end of the resistance element is connected to the base of the device and the other end of the resistance element is connected to the emitter of the device, the resistance of at least one of the resistance elements being a variable resistance varying with the voltage on the collector of the associated transistor device.

2. A circuit as in claim 1 wherein the at least one of the resistance elements comprises a voltage-controlled current regulating element, a control terminal of the regulating element being electrically connected to the collector of the associated transistor device such that the voltage on that collector derermines the rate of current flow between the base and emitter of the associated transistor device.

3. A circuit as in claim 2, wherein the at least one of the resistance elements also comprises a fixed resistor element connected in parallel with the current regulating element.

4. A circuit as in claim 1 wherein the resistance of both of the resistance elements is a variable resistance varying with the respective voltage on the collector of the associated transistor element.

5. A circuit as in claim 4, wherein each of the resistance elements comprises a voltage-controlled current regulating element, a control terminal of each of the regulating elements being electrically connected to the collector of the respective associated transistor device, the voltage on the respective collector determining the state of current flow between the base and emitter of the associated transistor device.

6. A circuit as in claim 5, wherein each of the resistance elements also comprises a fixed resistor element connected in parallel with the respective current regulating element.

7. A circuit as in claim 1, wherein the circuit is formed on a semiconductor wafer having p1, n1, p2, and n2 regions, wherein the outer surface of the p1 region has a first conductive layer extending thereacross and the outer surface of the n2 region has a second conductive layer extending thereacross, wherein one bipolar transistor device is defined by the p1, n1 and p2 regions and the other bipolar transistor device is defined by the n1, p2 and n2 regions, wherein the at least one of the resistance elements is defined by a portion of the n1 region that in part extends through apertures in the p1 region to contact the first conductive layer, and wherein the resistance of that resistance element varies with the thickness of the reverse-bias zone formed in the n1 region by a voltage differential applied between the first and second conductive layers.

8. A circuit as in claim 1, wherein the circuit is formed on a semiconductor wafer having n1, p1, n2, and p2 regions, wherein the outer surface of the n1 region has a first conductive layer extending thereacross and the outer surface of the p2 region has a second conductive layer extending thereacross, wherein one bipolar transistor device is defined by the n1, p1 and n2 regions and the other bipolar transistor device is defined by the p1, n2 and p2 regions, wherein the at least one of the resistance elements is defined by a portion of the p1 region that in part extends through apertures in the n1 region to contact the first conductive laer, and wherein the resistance of that resistance element varies with the thickness of the reverse-bias zone formed in the p1 region by a voltage differential applied between the first and second conductive layers.

9. A circuit as in claim 1, wherein the circuit is formed from discrete components, each transistor device being a discrete bipolar transistor, the at least one of the resistance elements comprising a field-effect transistor and a first resistor, the field-effect transistor having its current flow channel in series with the first resistor, the gate of the field-effect transistor being connected to the collector of the associated bipolar transistor such that the voltage on the collector controls the rate of the current flow between the base and emitter of the associated bipolar transistor, the circuit also comprising a diode positioned between the bases of the two bipolar transistors, the voltage drop across the diode defining the breakover voltage of the switching circuit.

10. A circuit as in claim 9, wherein the circuit also has a second resistor connected in parallel with the at least one of the resistance elements.

11. A solid state switching circuit adapted to be connected between two electrical lines in overvoltage protection applications, the circuit comprising:
(a) a diode bridge formed by a set of first diodes, the bridge extending between the two electrical lines and defining a positive intermediate node and a negative intermediate node;
(b) two bipolar transistors, each transistor having its base connected to the collector of the other transistor, a first one of the bipolar transistors having its emitter connected to one of the intermediate nodes and the other one of the bipolar transistors having its emitter connected to the other intermediate node;
(c) two first resistors of generally equal value, each resistor being connected between the base and emitter of a respective one of the transistors;
(d) a zener diode connected between the bases of the two transistors, the zener diode establishing the breakover voltage of the switching circuit; and,
(e) a variable resistance element defined by a field-effect transistor extending in series with a second resistor, the resistance element extending between the one of the intermediate nodes and the base of the first one of the bipolar transistors, the collector of the first one of the bipolar transistors being connected to the gate of the field-effect transistor for controlling the rate of current flow through the resistance element.

* * * * *